United States Patent [19]

Yamaguchi et al.

[11] Patent Number: 4,934,064
[45] Date of Patent: Jun. 19, 1990

[54] ALIGNMENT METHOD IN A WAFER PROBER

[75] Inventors: Nobuhito Yamaguchi; Mitsuya Sato; Takao Ukaji; Taro Ohmori; Eiichi Murakami, all of Yokohama, Japan

[73] Assignee: Canon Kabushiki Kaisha, Tokyo, Japan

[21] Appl. No.: 240,003

[22] Filed: Sep. 2, 1988

[30] Foreign Application Priority Data

Apr. 9, 1987 [JP] Japan ................................. 62-222704

[51] Int. Cl.$^5$ .............................................. G01B 7/00
[52] U.S. Cl. ...................................... 33/645; 33/613; 33/1 M; 324/158 F
[58] Field of Search ................. 33/645, 613, 1 M, 561; 324/158 F, 158 P

[56] References Cited

U.S. PATENT DOCUMENTS 4,052,793 10/1977 Coughlin ................................. 33/645
4,786,867 11/1988 Yamatsu ............................ 324/158 F Primary Examiner—Harry N. Haroian
Attorney, Agent, or Firm—Morgan & Finnegan

[57] ABSTRACT

A wafer prober for contacting probe needles of a probe card to bonding pads of a chip formed on a wafer, for allowing examination of characteristics of the chip, is disclosed. The wafer prober includes a wafer holder for holding a wafer and moving the same in X and Y directions. By the wafer holder, the wafer can be moved from an alignment information detecting station whereat alignment information can be detected by use of a TV camera, to an examining station whereat the probe needles of the probe card are used for the examination. The position of the wafer in a Z direction at the time when the alignment information is detected by the TV camera, can be made substantially coincident with the position of the wafer in the Z direction at the time when the probe needles contact the bonding pads. By this, an error caused by the movement of the wafer holder in the Z direction does not affect against the alignment accuracy of the wafer in the X and Y directions, such that the probe needles can correctly contact the bonding pads.

5 Claims, 2 Drawing Sheets

ALIGNMENT METHOD IN A WAFER PROBER

FIELD OF THE INVENTION AND RELATED ART

This invention relates to an alignment method in a wafer prober for conducting probing examination of semiconductor chips. More particularly, the invention is concerned with an alignment method in a wafer prober, for allowing automatic alignment between bonding pads of each semiconductor chip and probe needles of a probe card placed in the wafer prober.

A wafer prober is known as an apparatus for use in the examination of characteristics of a number of semiconductor chips formed on each semiconductor wafer.

Actual examination is performed by an apparatus called an "IC tester", and a wafer prober is used to establish correct electrical connection between this IC tester and each semiconductor chip on a wafer. This electrical connection is provided by use of a printed board, called a "probe card" having contact needles (probe needles) provided correspondingly to the positions of bonding pads of each semiconductor chip. Usually, in a wafer prober and for automatically performing accurate alignment between the probe needles and the bonding pads, such information as obtainable from scribe lines on a wafer or from an image of a chip is used. Particularly, in consideration of recent demand of higher precision for the alignment accuracy, a method wherein an image of a chip is picked up by use of a TV camera or otherwise disposed above a wafer and, by processing the image, alignment information necessary for accurate alignment is obtained, is considered as an effective method.

Conventionally, a wafer prober is provided with a probe card mounting mechanism which includes a structure for displacing a probe card vertically (in a Z direction). Owing to the provision of such a structure, the prober can be used with many varieties of probe cards which are different in the height of probe card printed boards and probe needle tips. Recently, however, in consideration of the increase in the number of probe needles resulting from the enlargement of a semiconductor device or the increase in the speed of probe examination, many probers have a high-frequency test kit disposed just above a probe card, and the probe examination is effected by using this. As a result, in such probers, it is difficult to place the vertically moving mechanism at the probe card mounting portion. In consideration thereof, recent wafer probers are usually arranged so that a probe card is fixedly supported with respect to the vertical direction; that the height of the probe needle tips is memorized temporally; and that, when a wafer is to be pressed from the below against the probe needles, a wafer chuck holding the wafer is moved upwardly (in the Z direction) by a suitable height corresponding to the memorized height. Thus, each time a different probe card is used, the probe examination is made with a different wafer height.

SUMMARY OF THE INVENTION

In conventional wafer probers, an imagewise information detecting device for the detection of alignment information, such as a TV camera, is fixedly secured to the major assembly of the wafer prober and, as a result of which, the height thereof can not be changed easily. Also, where the height of each probe card when it is mounted in the prober is fixed, as described hereinbefore, the height of the probe needle tips is not constant. As a result, there occurs a difference between the height of a wafer when the imagewise information for the alignment purpose is detected and the height of a wafer when an actual probe examination is made. This requires displacement of the wafer chuck in the vertical direction (Z direction) by an amount corresponding to that difference. Upon such displacement, there is a possibility of tilt of the axis of vertical displacement of the wafer chuck, non-smooth or yawing movement of the wafer chuck, or otherwise.

Conventionally, where alignment information is to be detected from imagewise information, the wafer chuck is first rotated to effect $\theta$-error correction and, after removing the $\theta$-error, the positional information is detected and the alignment operation is made. However, by the rotation of the wafer chuck, the direction of the tilt of the axis of the upward and downward movement of the wafer chuck is rotationally displaced. Therefore, when the height of the wafer chuck as the alignment information is detected differs from the height of the wafer chuck at the time of the probe examination, there occurs an error corresponding to the difference therebetween.

For this reason, in conventional wafer probers of the type described above, there is a possibility that the alignment information itself contains an error. This is one factor of the difficulties by which the prober can not sufficiently meet the demand of further improvements in the alignment accuracy.

Although the precision can be improved by increasing the precision of the axis of the vertical movement, there is a limitation and a corresponding increase in the cost is necessary.

It is accordingly a primary object of the present invention to provide an alignment method which is applicable to a wafer prober and which assures improved precision of the alignment between probe needles (needle group) of a probe card and bonding pads (pad group) of each chip formed on a wafer.

Briefly, in accordance with one aspect of the present invention, to achieve the above object, the imagewise information is detected, at the wafer surface height corresponding to that as assumed when the probe needles actually contact the bonding pads of a semiconductor device (chip) and the probe examination is effected. For example, there is provided a mechanism for vertically moving (in the Z direction) an imagewise information detecting device such as a TV camera, so that the information concerning the probe test and the alignment can be detected at the same height, without displacing the probe card. In other words, in conventional wafer probers the height whereat a wafer is accessed is determined by using, as a reference, the major assembly of the apparatus to which an imagewise information detecting device or otherwise is fixed. In the present invention, as compared therewith, what is used as a reference is the height of the upper surface of a wafer as the probe examination is made, which height itself is variable with the height of the probe needle tips. By using the same height for the execution of the alignment between probe needles and bonding pads, it is possible to avoid those components of an error related to the precision of the axis of vertical (Z-axis) movement that have a reproducibility (the error being contained in an alignment error in horizontal directions or, in other words, in a plane of X-Y coordinate in the case of conventional wafer probers). Therefore, it is possible to assure high-precision alignment.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
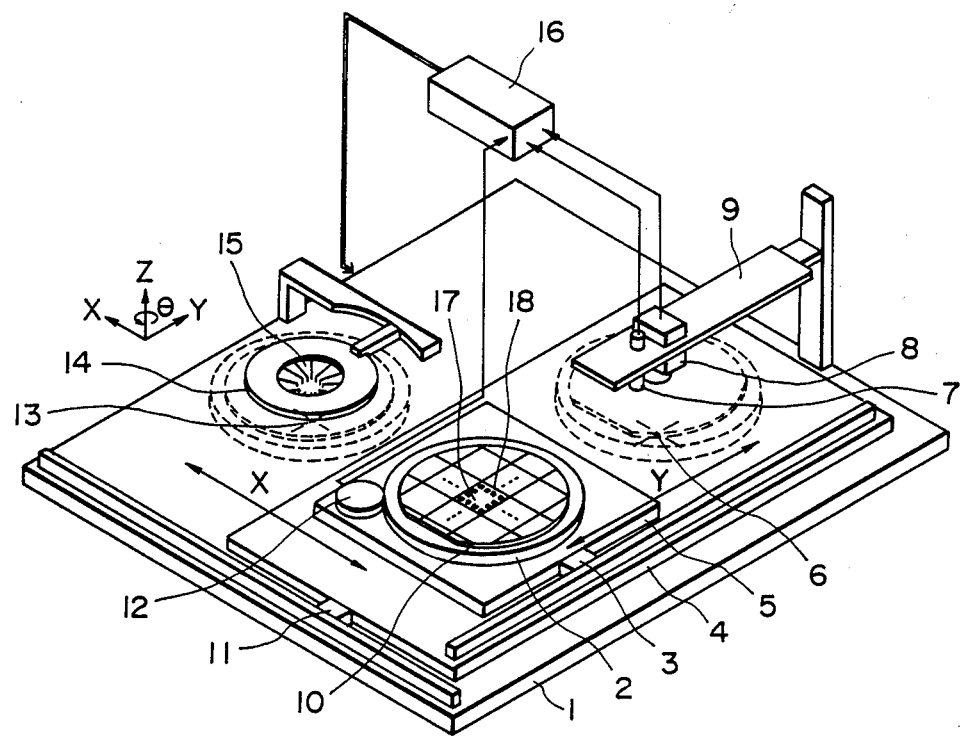
FIG. 1 is a perspective view showing the structure of a wafer prober according to one embodiment of the present invention.

FIG. 1 shows one embodiment of the present invention. Disposed on a base table 1 of a wafer prober are an X-table 4 and a Y-table 5 which are movable to move a wafer chuck 2 to a desired position with respect to horizontal (X and Y) directions. The X-table 4 and the Y-table 5 are moved in the X and Y directions, respectively, by means of an X-drive unit 11 and a Y-drive unit 3, respectively. Each of the drive units 3 and 11 is formed by use of a linear motor, for example. The positions of the tables 4 and 5 in an X-Y coordinate can be discriminated by a controller 16 on the basis of the detection, by using detectors (not shown) movable as a unit with the tables 4 and 5, respectively, of the graduations of scales (not shown) provided on the base table 1 and the Y-table 5, respectively. The wafer chuck 2 is arranged to hold a wafer 10 on its upper surface by vacuum attraction and is structured to move the wafer 10 in a rotational ($\theta$) direction and in a vertical direction (Z direction). Positional information detecting station 6 is defined above the base table 1 (X-Y coordinate) and, above the station 6, there are provided a TV camera 8 (imagewise information detecting device) and an electrostatic sensor 7 for detecting the distance to the wafer in the direction of height (Z direction). The TV camera and the sensor are mounted as a unit and movably in the vertical direction (Z direction) by means of a camera Z-drive unit 9.

Figure 2:
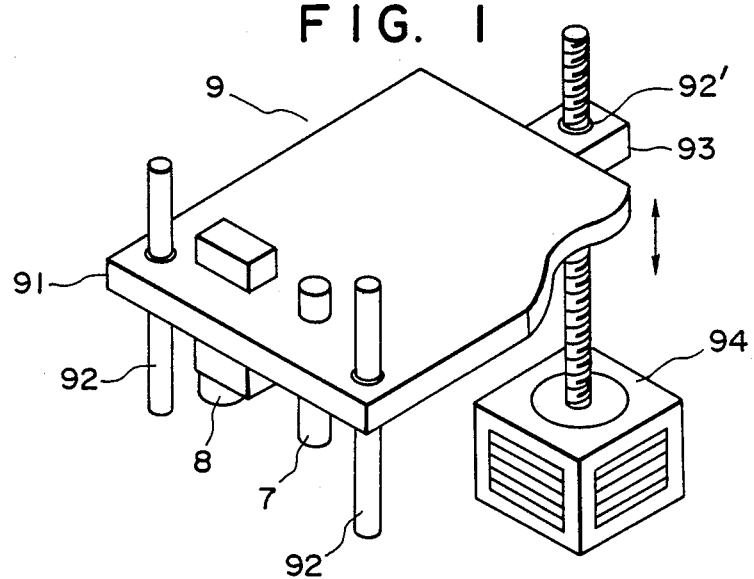
FIG. 2 is a perspective view showing a Z drive unit of the embodiment of FIG. 1.

In the camera Z-drive unit 9, as shown in FIG. 2, the gap measuring electrostatic sensor 7 and the TV camera 8 are held as a unit and placed in a predetermined interrelationship by a TV camera supporting table 91 which is supported by two guide shafts 92. The supporting table 91 is moved vertically (Z direction) by, for example, rotating a ball screw 921 by means of a pulse motor 94. The ball screw 92 is coupled to the supporting table 91 through a connection 93.

Referring back to FIG. 1, a probe card 14 is placed, rotatably in the $\theta$ direction, above a probe examining station 13 which is defined above the base table 1 (X-Y coordinate). The probe card 14 comprises a printed board having a plurality of contact needles (probe needles) 15. The probe needles 15 are positioned correspondingly respectively to a plurality of bonding pads 18 of each semiconductor chip 17 formed on the wafer 10. In accordance with the type of a wafer 10 used, the probe card 14 is replaced by another. Mounted on the Y-table 5 in the neighborhood of the wafer chuck 2 is a height sensor (height detecting means) 12 for measuring the height of the tips of the probe needles 15. For example, the sensor 12 may comprise a detecting means wherein a load cell is moved upwardly so that the probe needles contact thereto, whereby the height thereof is detected. The height sensor 12 is movable vertically and, with the movement of the wafer chuck 2, it can be moved in the X and Y directions so that it is positioned at the imagewise information detecting station 6 or the probe examining station 13. The wafer prober of the present embodiment is controlled by the controller 16, and all the information signals are transmitted to the controller 16. Also, all the driving units operate in accordance with the instructions from the controller 16.

The probe examination procedure to each semiconductor device (chip) of the wafer 10 by use of the prober of the described structure will now be explained.

First, a probe card 14 corresponding to a wafer 10 to be examined, is correctly mounted to the wafer prober. At this time, the height of the tips of the probe needles 15 differs with the type of a probe card 14 used. Accordingly, it is necessary to effect the height setting each time the card replacement is made.

Figure 3:
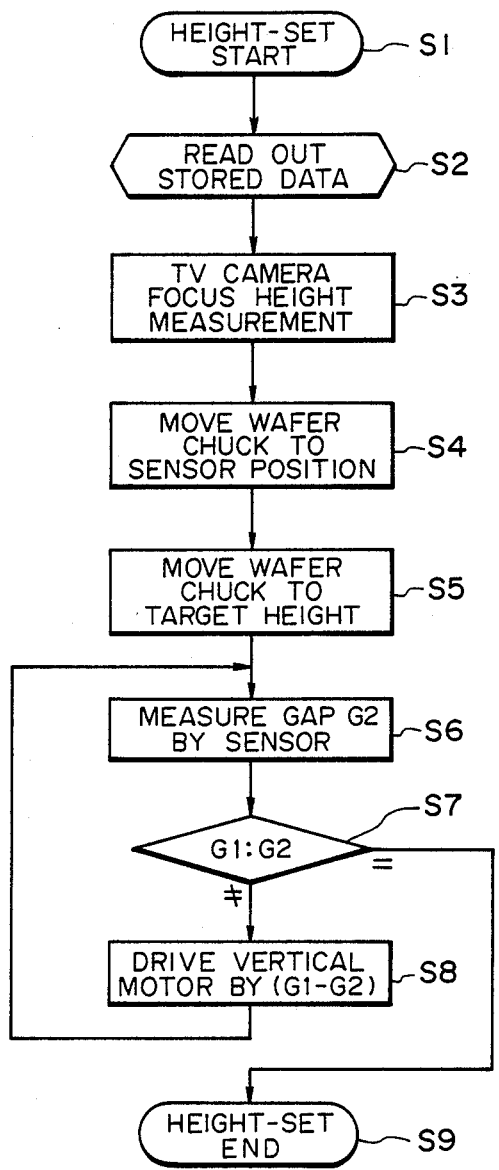
FIG. 3 is a flow chart showing the height setting operation of the embodiment of FIG. 1.

The height setting is executed in such manner as shown in the flow chart of FIG. 3. Namely, when the height setting starts at step S1, first, within the controller 16, the already stored data which concerns the position of the TV camera 8 in the X-Y coordinate, the position of the center of the electrostatic sensor 7 in the X-Y coordinate, the gap ($=G1$) as assumed when an object placed at the focal point position (height) of the TV camera 8 is measured by the electrostatic sensor 7, etc., is read out from a memory and is supplied to a control portion (step S2). Subsequently, at step S3, the X-table 4 and the Y-table 5 are moved so as to bring the height sensor 12 to the probe examining station 13 and the measurement is made by use of this height sensor 12. The information concerning the height of the probe needle 15 tip obtained at this station is memorized into the memory of the controller 16 as the information concerning a target focus height of the TV camera. Additionally, before conducting the electric probe examination, a wafer 10 is placed on and held by the wafer chuck 2 and, while manually observing the probe needles 15 from the above by use of a microscope, the wafer chuck 2 is moved upwardly and/or downwardly so that the probe needles 15 can be correctly contacted to the bonding pads 18 of each semiconductor chip 17. The position of the semiconductor chip to be examined is detected and memorized into the controller 16. Alternatively, the automatic probe needle detection, the automatic bonding pad detection, the automatic optimum relative position calculation and the like may be effected to detect the position of the semiconductor chip to be examined, for assuring correct contact, and the thus detected position may be memorized into the controller 16.

At this time, the height of the tips of the probe needles 15 does not coincide with the height of the focus of the TV camera 8. In order to bring them into coincidence, at step S4, the wafer chuck 2 is moved to the position (X-Y coordinate) of the electrostatic sensor 7 and, thereafter, at step S5 the wafer chuck 2 is driven vertically so that the height of the upper surface of the wafer 10 held on the wafer chuck 2 is so set that it becomes equal to the height of the probe needle 15 tip (the target height of the focus position of the TV camera 8) as having been measured at step S3 and having been memorized into the memory of the controller 16. The height at this time is controlled by the number of pulses of a pulse signal to be applied to a pulse motor (not shown), driving the wafer chuck 2 in the Z direction.

Subsequently, at step S6 the gap G2 to the upper surface of the wafer 10 is measured by use of the electrostatic sensor 7. Whether or not the measured gap G2 is equal to the above-described gap G1, is discriminated at step S7. If G2=G1, the sequence goes to step S9 and the height setting is completed. If G2≠G1, the sequence goes to step S8 and the TV camera 8 is moved in the Z direction by the Z-drive unit 9 by an amount corresponding to the difference "G1−G2". Namely, by using the motor 94 shown in FIG. 2, the ball screw 921 is rotated to control the position of the supporting table 91 so as to control the position of the TV camera 8, in order to assure that the TV camera is focused (substantially) upon the upper surface of the wafer 10 held on the upper surface of the wafer chuck 2. Thereafter, the sequence goes back to step S6 and the measurement of the gap G2 is made again. Until G1 becomes substantially equal to G2, these operations are repeated. During these operations, the position of the TV camera 8 in the horizontal direction (X-Y coordinate) may change with the vertical motion of the supporting table 91. However, the position of the TV camera 8 is registered after the vertical motion and, upon the alignment operation made thereafter, the TV camera 8 is not moved vertically. Therefore, the change in the X and Y directions due to the vertical motion of the TV camera 8 does not affect against the precision of alignment between the probe needles 15 and the bonding pads 18 made thereafter.

Next, the procedure of actually effecting the electric probe examination will be explained. The situation is that the replacement of a probe card 14 has been made and the above-described setting by use of a first wafer has been completed so that a second wafer and wafers following thereto are to be examined. First, a wafer 10 is introduced onto the wafer chuck 2 and is held thereby by vacuum attraction. At this time, the positions of semiconductor chips 17 of the wafer 10 as now held on the wafer chuck 2 have not yet been accurately detected. Therefore, at this stage it is difficult to bring the probe needles 15 and the bonding pads 18 of each semiconductor chip 17 into correct contact with each other. In consideration of this, the wafer chuck 2 is moved to the imagewise information detecting station 6 and, by use of the TV camera 8, the image of the semiconductor chip 17 is picked up. The obtained information is transmitted to the controller 16 and, in this controller 16 and from this imagewise information, the amount of drive for the X-table 4 and the Y-table 5 as well as the relationship of the position of each semiconductor chip with the base table 1 (X-Y coordinate), are determined. Subsequently, the wafer chuck 2 is moved to the probe examining station 13 and, by using the above-described information concerning the position of each semiconductor chip with respect to the base table as well as the information concerning each semiconductor chip for assuring correct contact between the probe needles 15 and the bonding pads 18, as stored in the controller 16, the probe needles 15 are aligned with the semiconductor chip 17. The alignment information used at this time has been obtained at the height same as the height of the wafer upper surface as assumed when the probe needles 15 contacts the bonding pad 18. Therefore, those components of the error related to the axis of vertical movement that have reproducibility can be avoided, with the result that accurate alignment is ensured.

Subsequently, while retaining electrical contact between the probe needles 15 and the bonding pads 18 of the semiconductor chip 17 to be examined, an unshown tester is used to effect the inspection of the electric circuit of the semiconductor chip 17.

In this manner, the probe examination is made to all the semiconductor chips on the wafer, and after the examination is completed, the wafer is discharged. The next wafer is introduced to the wafer chuck and, in this manner, the probe examination is repeated to plural wafers of the same type.

In the above-described embodiment, the present invention is applicable only by adding to conventional wafer probers a vertically moving mechanism for a TV camera 8. Therefore, with a simple design change or modification and with a low cost, the precision can be improved significantly.

While in the above-described embodiment a TV camera 8 is used as the imagewise information detecting means, the TV camera may be replaced by one-dimensional CCD sensor. Alternatively, other methods for detecting positional information of the semiconductor chip on a wafer 10, rather than the imagewise information thereof, may be used. As an example, a laser beam may be projected on a wafer to detect a scribe line or lines thereof. Also, while in the described embodiment a height sensor 12 is used to detect the height of the tips of the probe needles 15, the height may be measured manually and the height information may be inputted manually without use of such specific detecting means.

Moreover, while in the described embodiment the upper surface of a wafer 10 held on the wafer chuck 2 is placed at the same height, when it is at the imagewise information detecting station 6 and at the probe examining station 13, to thereby allow the detection of imagewise information and the probe examination to be made at the same height, this is not always necessary. Namely, in consideration of that the thickness of plural wafers 10 is substantially constant, the position of the wafer chuck 2 may be controlled so that the height of the upper surface of the wafer chuck is substantially the same as it is placed at the station 6 and at the station 13.

In accordance with the present invention, as described hereinbefore, the probe needles and the bonding pads can be aligned at higher precision. Also, in an occasion where an additional function is to be added to a wafer prober and where, as a result of which, the vertical motion of a measuring system is required for the detection of specific information, in addition to the vertical motion of the wafer chuck, the present invention provides a substantial effect in respect to the precision improvement.

Further, the precision assurance concerning the axis of vertical movement is required only in respect to the reproducibility. Therefore, the vertical motion mechanism may be of a simple structure and requires a low cost.

While the invention has been described with reference to the structures disclosed herein, it is not confined to the details set forth and this application is intended to cover such modifications or changes as may come within the purposes of the improvements or the scope of the following claims.

What is claimed is:

1. A method for aligning a probe needle of a probe card with a bonding pad of a wafer, said method comprising the steps of:

moving a wafer holder for holding said wafer in a Z direction so that, at an alignment information detecting station different from an inspection station at which the probe card is provided, the position of a reference plane related to the wafer in the Z direction becomes substantially equal to the position of the reference plane in the Z direction when the probe needle contacts the bonding pad at the inspection station;

moving a photoelectric detector provided at the alignment information detecting station in the Z direction so that the photoelectric detector and the reference plane are brought into a predetermined positional relationship with respect to the Z direction; and photoelectrically detecting the surface of the wafer to obtain alignment information for aligning the bonding pad with the probe needle with respect to X and Y directions.

2. A method for aligning a probe needle of a probe card with a bonding pad of a wafer, said method comprising the steps of:

moving a wafer holder for holding said wafer in a Z direction so that, at an alignment information detecting station different from an inspection station at which the probe card is provided, the position of a reference plane related to the wafer holder in the Z direction becomes substantially equal to the position of the reference plane in the Z direction when the probe needle contacts the bonding pad at the inspection station;

moving a photoelectric detector provided at the alignment information detecting station in the Z direction so that the photoelectric detector and the reference plane are brought into a predetermined positional relationship with respect to the Z direction; and photoelectrically detecting the surface of the wafer to obtain alignment information for aligning the bonding pad with the probe needle with respect to X and Y directions.

3. A wafer prober for aligning a bonding pad of a wafer with a probe needle of a probe card, comprising:

a wafer holder for holding the wafer;

a photoelectric detector for photoelectrically detecting the surface of the wafer to obtain alignment information for aligning the bonding pad with the probe needle in X and Y directions, said photoelectric detector being provided at an alignment information detecting station different from an inspection station at which the probe card is provided;

control means for controlling movement of the wafer holder in a Z direction so that, at the alignment information detecting station, the position of a reference plane related to the wafer or wafer holder in the Z direction becomes substantially equal to the position of the reference plane in the Z direction to be assumed when the probe needle contacts the bonding pad at the inspection station; and Z drive means for moving said photoelectric detector in the Z direction so as to bring said photoelectric detector into a predetermined positional relationship with the reference plane.

4. A wafer prober according to claim 3, further comprising a measurement device for measuring the position of a free end of the probe needle, wherein said control means controls the movement of the wafer holder in the Z direction on the basis of an output of said measurement device.

5. A wafer prober according to claim 4, further comprising an X-Y stage for moving the wafer holder in X and Y directions between the inspection station and the alignment information detecting station, wherein said measurement device is moved by said X-Y stage in the X and Y directions.

* * * * *

UNITED STATES PATENT AND TRADEMARK OFFICE
CERTIFICATE OF CORRECTION

PATENT NO. : 4,934,064
DATED : June 19, 1990
INVENTOR(S) : Nobuhito Yamaguchi, et al.

It is certified that error appears in the above-identified patent and that said Letters Patent is hereby corrected as shown below:

Column 3, line 53, change "921" to --92-- (both occurence).

Column 5, line 13, change "921" to --92-- (both occurence).

Signed and Sealed this

Twenty-eighth Day of April, 1992

Attest:

HARRY F. MANBECK, JR.

Attesting Officer      Commissioner of Patents and Trademarks